United States Patent
Tierling

(10) Patent No.: US 7,151,432 B2
(45) Date of Patent: Dec. 19, 2006

(54) CIRCUIT AND METHOD FOR A SWITCH MATRIX AND SWITCH SENSING

(75) Inventor: Kollin Tierling, Milpitas, CA (US)

(73) Assignee: Immersion Corporation, San Jose, CA (US)

( * ) Notice: Subject to any disclaimer, the term of this patent is extended or adjusted under 35 U.S.C. 154(b) by 503 days.

(21) Appl. No.: 09/957,004

(22) Filed: Sep. 19, 2001

(65) Prior Publication Data

US 2003/0058845 A1    Mar. 27, 2003

(51) Int. Cl.
*H03K 17/00* (2006.01)
(52) U.S. Cl. .................. 340/2.28; 340/2.29; 340/14.4; 340/14.5; 340/14.6; 340/14.69; 341/26
(58) Field of Classification Search ...... 340/14.4–14.6, 340/2.8, 2.9, 2.7, 14.61, 14.62–14.69; 341/22, 341/26, 20, 24, 25
See application file for complete search history.

(56) References Cited

U.S. PATENT DOCUMENTS

| | | | |
|---|---|---|---|
| 2,972,140 A | 2/1961 | Hirsch | |
| 3,157,853 A | 11/1964 | Hirsch | |
| 3,220,121 A | 11/1965 | Culter | |
| 3,497,668 A | 2/1970 | Hirsch | |
| 3,517,446 A | 6/1970 | Corlyon | |
| 3,623,064 A | 11/1971 | Kagan | |
| 3,689,889 A * | 9/1972 | Feucht et al. | 340/14.69 |
| 3,877,008 A | 4/1975 | Payne | |
| 3,902,687 A | 9/1975 | Hightower | |
| 3,903,614 A | 9/1975 | Diamond et al. | |
| 3,911,416 A | 10/1975 | Feder | |
| 4,127,752 A | 11/1978 | Lowthorp | |
| 4,151,374 A | 4/1979 | Fukuhara et al. | |
| 4,160,508 A | 7/1979 | Salisbury, Jr. | |
| 4,236,325 A | 12/1980 | Hall et al. | |
| 4,262,549 A | 4/1981 | Schwellenbach | |
| 4,268,827 A | 5/1981 | Hughen et al. | |
| 4,281,579 A | 8/1981 | Bennett, Sr. | |
| 4,303,907 A | 12/1981 | Wilson | |
| 4,333,070 A | 6/1982 | Barnes | |

(Continued)

FOREIGN PATENT DOCUMENTS

EP     0 349 086 A1    1/1990

(Continued)

OTHER PUBLICATIONS

Aukstakalnis et al., "Silicon Mirage: The Art and Science of Virtual Reality," ISBN 0-938151-82-7, pp. 129-180, 1992.

(Continued)

*Primary Examiner*—Brian Zimmerman
*Assistant Examiner*—Nam Nguyen
(74) *Attorney, Agent, or Firm*—Kilpatrick Stockton LLP

(57) ABSTRACT

Aspects of a switch matrix circuit are provided. In accordance with a circuit aspect, a plurality of switches are organized in a row and column configuration. Coupled to the plurality of switches is a current sensing circuit. The current sensing circuit includes a transistor and at least one resistor per column of the plurality of switches. Current amplified by the transistor and converted by the at least one resistor in a column is sensed as a logic level indicative of a switch status within the column for a selected row. The current sensing arrangement may also be used in an embodiment utilizing bi-directional signal control to minimize the number of I/O lines required to scan the switch matrix. The bi-directional signal scanning may also be implemented in another embodiment that senses voltage levels to determine switch closures.

25 Claims, 6 Drawing Sheets

U.S. PATENT DOCUMENTS

| | | | |
|---|---|---|---|
| 4,374,384 A | 2/1983 | Moates | |
| 4,464,117 A | 8/1984 | Forest | |
| 4,484,191 A | 11/1984 | Vavra | |
| 4,513,235 A | 4/1985 | Acklam et al. | |
| 4,581,491 A | 4/1986 | Boothroyd | |
| 4,599,070 A | 7/1986 | Hladky et al. | |
| 4,667,181 A * | 5/1987 | Hastreiter | 341/26 |
| 4,673,933 A * | 6/1987 | Bauer | 341/22 |
| 4,708,656 A | 11/1987 | de Vries et al. | |
| 4,713,007 A | 12/1987 | Alban | |
| 4,725,816 A | 2/1988 | Petterson | |
| 4,794,392 A | 12/1988 | Selinko | |
| 4,885,565 A | 12/1989 | Embach | |
| 4,891,764 A | 1/1990 | McIntosh | |
| 4,930,770 A | 6/1990 | Baker | |
| 4,934,694 A | 6/1990 | McIntosh | |
| 5,019,761 A | 5/1991 | Kraft | |
| 5,022,384 A | 6/1991 | Freels | |
| 5,022,407 A | 6/1991 | Horch et al. | |
| 5,035,242 A | 7/1991 | Franklin et al. | |
| 5,038,089 A | 8/1991 | Szakaly | |
| 5,078,152 A | 1/1992 | Bond et al. | |
| 5,138,246 A * | 8/1992 | Kobayashi | 320/136 |
| 5,151,554 A * | 9/1992 | Matsuda | 84/655 |
| 5,165,897 A | 11/1992 | Johnson | |
| 5,175,459 A | 12/1992 | Danial et al. | |
| 5,186,695 A | 2/1993 | Mangseth et al. | |
| 5,212,473 A | 5/1993 | Louis | |
| 5,240,417 A | 8/1993 | Smithson et al. | |
| 5,271,290 A | 12/1993 | Fischer | |
| 5,275,174 A | 1/1994 | Cook | |
| 5,283,970 A | 2/1994 | Aigner | |
| 5,299,810 A | 4/1994 | Pierce et al. | |
| 5,309,140 A | 5/1994 | Everett, Jr. et al. | |
| 5,334,027 A | 8/1994 | Wherlock | |
| 5,424,731 A * | 6/1995 | Kronberg | 341/26 |
| 5,436,622 A | 7/1995 | Gutman et al. | |
| 5,437,607 A | 8/1995 | Taylor | |
| 5,466,213 A | 11/1995 | Hogan et al. | |
| 5,486,824 A * | 1/1996 | Kinerk et al. | 341/26 |
| 5,547,382 A | 8/1996 | Yamasaki et al. | |
| 5,575,761 A | 11/1996 | Hajianpour | |
| 5,677,687 A * | 10/1997 | Valdenaire | 341/26 |
| 5,690,582 A | 11/1997 | Ulrich et al. | |
| 5,760,714 A * | 6/1998 | Zimmerman | 341/26 |
| 5,766,016 A | 6/1998 | Sinclair et al. | |
| 5,785,630 A | 7/1998 | Bobick et al. | |
| 6,111,577 A | 8/2000 | Zilles et al. | |
| 6,160,489 A | 12/2000 | Perry et al. | |
| 6,422,941 B1 | 7/2002 | Thorner et al. | |

FOREIGN PATENT DOCUMENTS

| | | |
|---|---|---|
| EP | 1014754 | 6/2000 |
| EP | 1086690 | 5/2001 |
| JP | H2-185278 | 7/1990 |
| JP | H4-8381 | 1/1992 |
| JP | H5-192449 | 8/1993 |
| JP | H7-24147 | 1/1995 |
| JP | 2001014975 | 1/2001 |
| WO | WO 03/026130 A1 | 3/2003 |

OTHER PUBLICATIONS

Bliss, "Optical-to-Tactile Image Conversion for the Blind," IEEE Transactions on Man-Machine Systems, vol. MMS-11, No. 1, Mar. 1970.

Cadler, "Design of A Force-Feedback Touch-Introducing Actuator For Teleoperator Robot Control," Bachelor of Science Thesis, MIT, Jun. 23, 1983.

"Cyberman Technical Specification," Logitech Cyberman SWIFT Supplement, Apr. 5, 1994.

Eberhardt et al., "Including Dynamic Haptic Perception by The Hand: System Description and Some Results," DSC-vol. 55-1, Dynamic Systems and Control: vol. 1, ASME 1994.

Gobel et al., "Tactile Feedback Applied to Computer Mice," International Journal of Human-Computer Interaction, vol. 7, No. 1, pp. 1-24, 1995.

Johnson, "Shape-Memory Alloy Tactile Feedback Actuator," Armstrong Aerospace Medical Research Laboratory, AAMRL-TR-90-039, Aug., 1990.

Kaczmarek et al., "Tactile Displays," Virtual Environment Technologies.

Kontarinis et al., "Tactile Display of Vibratory Information in Teleoperation and Virtual Environments," PRESENCE, 4(4):387-402, 1995.

Lake, "Cyberman from Logitech," GameBytes, 1994.

Noll, "Man-Machine Tactile," SID Journal, Jul./Aug. 1972 Issue.

Ouhyoung et al., "The Development of A Low-Cost Force Feedback Joystick and Its Use in the Virtual Reality Environment," Proceedings of the Third Pacific Conference on Computer Graphics and Applications, Pacific Graphics '95, Seoul, Korea, Aug. 21-24, 1995.

Patrick, "Design, Construction, and Testing of a Fingertip Tactile Display for Interaction with Virtual and Remote Environments," Master of Science Thesis, MIT, Nov. 8, 1990.

Pimentel et al., "Virtual Reality: through the new looking glass," $2^{nd}$ Edition; McGraw-Hill, ISBN 0-07-050167-X, pp. 41-202, 1994.

Rosenberg, "Virtual Fixtures: Perceptual Overlays Enhance Operator Performance in Telepresence Tasks," Ph.D. Dissertation, Stanford University, Jun. 1994.

Safe Flight Instruments Corporation, "Coaxial Control Shaker," Part No. C-25502, Jul. 1, 1967.

Wiker, "Teletouch Display Development: Phase 1 Report," Technical Report 1230, Naval Ocean Systems Center, San Diego, Apr. 17, 1989.

Yamakita et al., "Tele-Virtual Reality of Dynamic Mechanical Model," Proceedings of the 1992 IEEE/RSJ International Conference on Intelligent Robots and Systems, Raleigh, NC, Jul. 7-10, 1992.

International Search Report mailed Aug. 4, 2005 corresponding to PCT/US 02/29677.

International Search Report mailed Apr. 25, 2005 corresponding to PCT/US/02/29877.

Baigrie, "Electric Control Loading —A Low Cost, High Performance Alternative," Proceedings of Interservice/Industry Training Systems Conference, pp. 247-254, Nov. 6-8, 1990.

Iwata, "Pen-based Haptic Virtual Environment," 0-7803-1363-Jan. 1993 IEEE, pp. 287-292, 1993.

Russo, "The Design and Implementation of a Three Degree of Freedom Force Output Joystick," MIT Libraries Archives pp. 1-131, May 1990, archived Aug. 14, 1990.

Brooks et al., "Hand Controllers for Teleoperation —A State-of-the-Art Technology Survey and Evaluation, " JPL Publication 85-11, NASA-CR-175890; N85-28559, pp. 1-84, Mar. 1, 1985.

Jones et al., "A perceptual analysis of stiffness," ISSN 0014-4819 Springer International (Springer-Verlag); Experimental Brain Research, vol. 79, No. 1, pp. 150-156, 1990.

Burdea et al., "Distributed Virtual Force Feedback, Lecture Notes for Workshop on Force Display in Virtual Environments and its Application to Robotic Teleoperation," 1993 IEEE International Conference on Robotics and Automation, pp. 25-44, May 2, 1993.

Snow et al., Model-X Force-Reflecting-Hand-Controller, NT Control No. NPO-17851; JPL Case No. 7348, pp. 1-4 with 45 pages of attachments, Jun. 15, 1989.

Ouh-Young, "Force Display in Molecular Docking," Doctoral Dissertation, University of North Carolina at Chapel Hil, UMI Order No. 9034744, p. 1-369, 1990.

Tadros, "Control System Design for a Three Degree of Freedom Virtual Environment Simulator Using Motor/Brake Pair Actuators," MIT Archive, pp. 1-88, Feb. 1990, archived Aug. 13, 1990.

Caldwell et al., "Enhanced Tactile Feedback (Tele-Taction) Using a Multi-Finctional Sensory System," 1050-4729/93, pp. 955-960, 1993.

Adelstein et al., "Design and Implementation of a Force Reflecting Manipulandum for Manual Control research," DSC —vol. 42, *Advances in Robotics*, pp. 1-12, 1992.

Gotow et al., "Controlled Impedance Test Apparatus for Studying Human Interpretation of Kinesthetic Feedback," WA11-11:00, pp. 332-337.

Stanley et al., "Computer Simulation of Interacting Dynamic Mechanical Systems Using Distributed Memory Parallel Processors," DSC-vol. 42, *Advances in Robotics*, pp. 55-61, ASME 1992.

Russo, "Controlling Dissipative Magnetic Particle Brakes in Force Reflective Devices," DSC-vol. 42, *Advances in Robotics*, pp. 63-70, ASME 1992.

Kontarinis et al., "Display of High-Frequency Tactile Information to Teleoperators," *Telemanipulator Technology and Space Telerobotics*, Won S. Kim, Editor, Proc. SPIE vol. 2057, pp. 40-50, Sep. 7-9, 1993.

Patrick et al., "Design and Testing of A Non-reactive, Fingertip, Tactile Display for Interaction with Remote Environments," *Cooperative Intelligent Robotics in Space*, Rui J. deFigueiredo et al, Editor, Proc. SPIE vol. 1387, pp. 215-222, 1990.

Adelstein, "A Virtual Environmnt System For The Study of Human Arm Tremor," *Ph. D. Dissertation*, Dept. of Mechanical Engineering, MIT, Jun. 1989, archived Mar. 13, 1990.

Bejczy, "Sensors, Controls, and Man-Machine Interface for Advanced Teleoperation," *Science*, vol. 208, No. 4450, pp. 1327-1335, 1980.

Bejczy et al., "Generalization of Bilateral Force-Reflecting Control of Maipulators," *Proceedings Of Fourth CISM —IFToMM*, Sep. 8-12, 1981.

McAffee et al., "Teleoperator Subsystem/Telerobot Demonstrator: Force Reflecting Hand Controller Equipment Manual," *JPL* 1988, JPL D-5172.

Minsky, "Computational Haptics: The Sandpaper System for Synthesizing Texture for a Force-Feedback Display," *Ph. D. Dissertation*, MIT, Jun. 1995, archived Jul. 6, 1995.

Jacobsen et al., "High Performance, Dextrous Telerobotic Manipulator With Force Reflection," *Intervention/ROV '91 Conference & Exposition*, Hollywood, Florida, May 21-23, 1991.

Shimoga, "Finger Force and Touch Feedback Issues in Dexterous Telemanipulation," *Proceedings of Fourth Annual Conference on Intelligent Robotic Systems for Space Exploration*, Rensselaer Polytechnic Institute, Sep. 30- Oct. 1, 1992.

IBM Technical Disclosure Bulletin, "Mouse Ball-Actuating Device With Force and Tactile Feedback," vol. 32, No. 9B, Feb. 1990.

Terry et al., "Tactile Feedback In A Computer Mouse," *Proceedings of Fourteenth Annual Northeast Bioengineering Conference, University of New Hampshire*, Mar. 10-11, 1988.

Howe, "A Force-Relating Teleoperated Hand System for the Study of Tactile Sensing in Precision Manipulation," *Proceedings of the 1992 IEEE International Conference on Robotics and Automation*, Nice, France, May 1992.

Eberhardt et al., "Omar —A Haptic display for speech perception by deaf and deaf-blind individuals," *IEEE Virtual Reality Annual International Symposium*, Seattle, WA, Sep. 18-22, 1993.

Rabinowitz et al., "Multidimensional tactile displays: Identification of vibratory intensity, frequency, and contractor area," *Journal of The Acoustical Society of America*, vol. 82, No. 4, Oct. 1987

Bejczy et al., "Kinesthetic Coupling Between Operator and Remote Manipulator," *International Computer Technology Conference, The American Society of Mechanical Engineers*, San Francisco, CA, Aug. 12-15, 1980.

Bejczy et al., "A Laboratory Breadboard System For Dual-Arm Teleoperation," *SOAR '89 Workshop, JSC*, Houston, TX, Jul. 25-27, 1989.

Ouhyoung et al., "A Low-Cost Force Feedback Joystick and Its Use in PC Video Games," *IEEE Transactions on Consumer Electronics*, vol. 41, No. 3, Aug. 1995.

Marcus, "Touch Feedback in Surgery," *Proceedings of Virtual Reality and Medicine The Cutting Edge*, Sep. 8-11, 1994.

Bejczy et al., "Universal Computer Control System (UCCS) For Space Telerobots," CH2413-3/87/0000/0318501.00 1987 IEEE, 1987.

\* cited by examiner

CIRCUIT AND METHOD FOR A SWITCH MATRIX AND SWITCH SENSING

FIELD OF THE INVENTION

The present invention relates to a switch matrix, and more particularly to an efficient, low cost switch matrix.

BACKGROUND OF THE INVENTION

In various interface devices, such as keypads, joysticks, wheels, gamepads, etc., detection of user selections of differing buttons and switches is needed. A standard switch matrix operates like a grid of horizontal and vertical conductors. At all points where the horizontal and vertical conductors cross, a switch is located. Pressing/closing the switch connects the two conductors. FIG. 1 presents a functional diagram of a standard matrix 8 of sixteen (16) switches, a 4×4 matrix. In the standard 16 switch matrix, four of the conductors or row lines, Row 0, Row 1, Row 2, and Row 3, are dedicated to drive a voltage corresponding to a logic level zero into the matrix. Only one of the four rows is driven low at a time, and the remaining rows are passively pulled high by the pull-up resistors 10a, 10b, 10c, or 10d on the top of the matrix. Four lines, Column 0, Column 1, Column 2, and Column 3, act as scan lines and are used to read back the state of the matrix. The row that is being scanned is the one that is at logic zero. The matrix is read by sampling the column conductors. For example, in the representation of FIG. 1, closed switches are indicated by circles and open switches are indicated by a cluster of dots. Thus, one switch, switch 14bc, is shown as closed. When Row 1 is driven low during a scan of the matrix, Column 2 reads zero, which indicates to a processor 12 driving the rows and performing the scan that the switch 14bc corresponding to Row 1 and Column 2 is closed/pressed.

In certain situations, a problem with a switch falsely being interpreted as closed can arise. FIG. 2 illustrates the closing/pressing of three switches, switch 14bb, switch 14cb, and switch 14cc, within the functional switch matrix diagram of FIG. 1. Row 1 is driven low by the processor 12 in order to determine if any of the switches on Row 1 are pressed. Because switch 14bb is pressed, Column 1 is connected to Row 1 and Column 1 is forced low. The processor 12 then correctly detects that the switch 14bb at the intersection of Row 1 and Column 1 is pressed. Because Column 1 is low, and switch 14cb is also pressed, Row 2 is also connected to Row 1 through Column 1. This connection pulls Row 2 low. Since button switch 14cc on Row 2 is also pressed, Column 2 is likewise pulled low. Since the processor 12 is driving Row 1 low, it interprets the low on Column 2 as though the switch 14bc were closed, as indicated by the triangles in FIG. 2. In this way, the switch 14bc is falsely interpreted as closed and is said to "ghost" the switch 14cc. In order to avoid such "ghosting", normally the design of a matrix solution must achieve the ability to properly identify closed switches while accounting for and overcoming the problem of "ghosting." In general, for the standard matrix diagram as shown in FIGS. 1 and 2, allowing only one of the scanning rows to be in the unique low state avoids the ghosting problem.

FIG. 3 illustrates a conventional standard 4×4 switch matrix 20 for switch selection that avoids ghosting. As shown, there are 16 switches, S1 through S16, and 16 diodes, D1 through D16. The diodes act as one-way valves, which allow electrons to flow through the switches in only one direction, i.e., from higher voltage (logic 1) to lower voltage (logic 0) in a conventional circuit. The diodes further act to avoid a short circuit that could exist by pressing any two switches in the same column, which would draw too much current from the processor 12 driving the output lines.

The diodes in the standard switch matrix also act to overcome the ghosting problem. In the example of FIG. 3, switch S6 is shown as closed. When ROW1 is driven low by the processor 22, diode D6 allows current to flow through S6, which pulls COL2 low. Note in the schematic, the diodes allow a row that is low (being scanned) to pull a column low. But, should a second switch be pressed within a column, such as switch S10, diode D10 prevents the low voltage on COL2 from pulling ROW2 low, since the diode D10 is reverse-biased (i.e., the side of the diode that the arrow is pointing to is at a higher voltage (+5V) than the opposite side of the diode (0V)). Since a reverse-biased diode will not conduct, only the row being driven low by the processor 22 will be low, and no other row will be pulled low, even if more than one switch in a column is pressed. In this manner, the ghosting problem, as described with reference to FIG. 2, will not occur.

While the conventional switch matrix can provide switch selection indication and avoid ghosting, the conventional approach is input/output (I/O) intensive, requiring significant processor resources in providing scan line processing. The conventional switch matrix further requires one diode per switch to prevent ghosting, which adds considerable accumulative cost as the number of switches within a matrix grows. Accordingly, what is needed is a switch matrix that is more efficient and has a lower cost than the conventional switch matrix.

SUMMARY OF THE INVENTION

Aspects of a switch matrix circuit are provided. In accordance with a circuit aspect, a plurality of switches are organized in a row and column configuration. Coupled to the plurality of switches is a current sensing circuit. The current sensing circuit includes a transistor and at least one resistor per column of the plurality of switches. Current amplified by the transistor and converted by the at least one resistor in a column is sensed as a logic level indicative of a switch status within the column for a selected row.

Through the present invention, a more efficient and lower cost switch matrix circuit is provided. In one embodiment, the present invention senses current instead of voltage to detect open or closed switches, where resistors and a transistor are used for each column of the matrix to provide selection signals to a processor to determine which button(s) of the matrix have been pressed. In addition, the number of I/O lines going to the processor can be reduced by utilizing bi-directional scan lines and scanning only one switch at a time instead of an entire row of switches at a time. A further embodiment that is a variation on the current sensing matrix can use an analog-to-digital converter to sense the switch states, but, likewise, uses the bi-directional scan lines to reduce the number of I/O linens going to the processor. These and other advantages will become readily apparent from the following detailed description and accompanying drawings.

DETAILED DESCRIPTION OF THE INVENTION

The present invention relates to a switch matrix circuit. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 1:
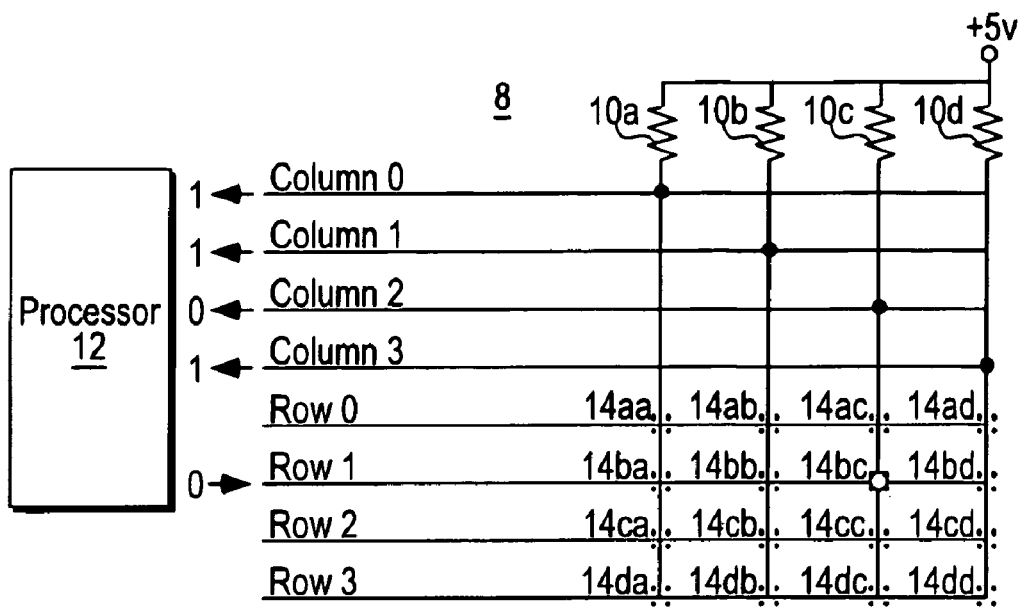
FIG. 1 illustrates a functional diagram of a standard matrix of 16 switches.
Figure 2:
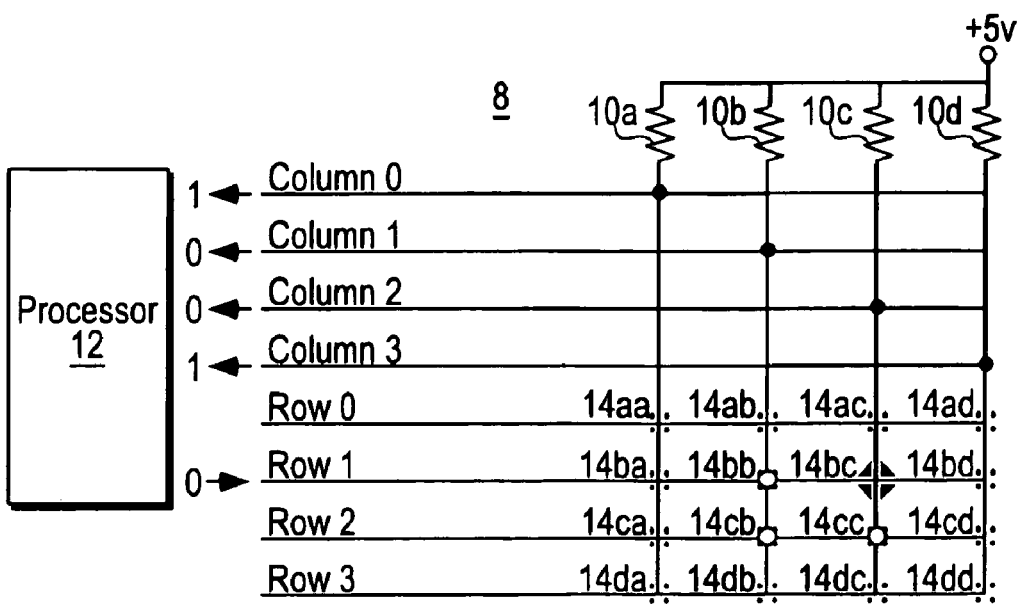
FIG. 2 illustrates the closing/pressing of three switches within the functional switch matrix diagram of FIG. 1.
Figure 3:
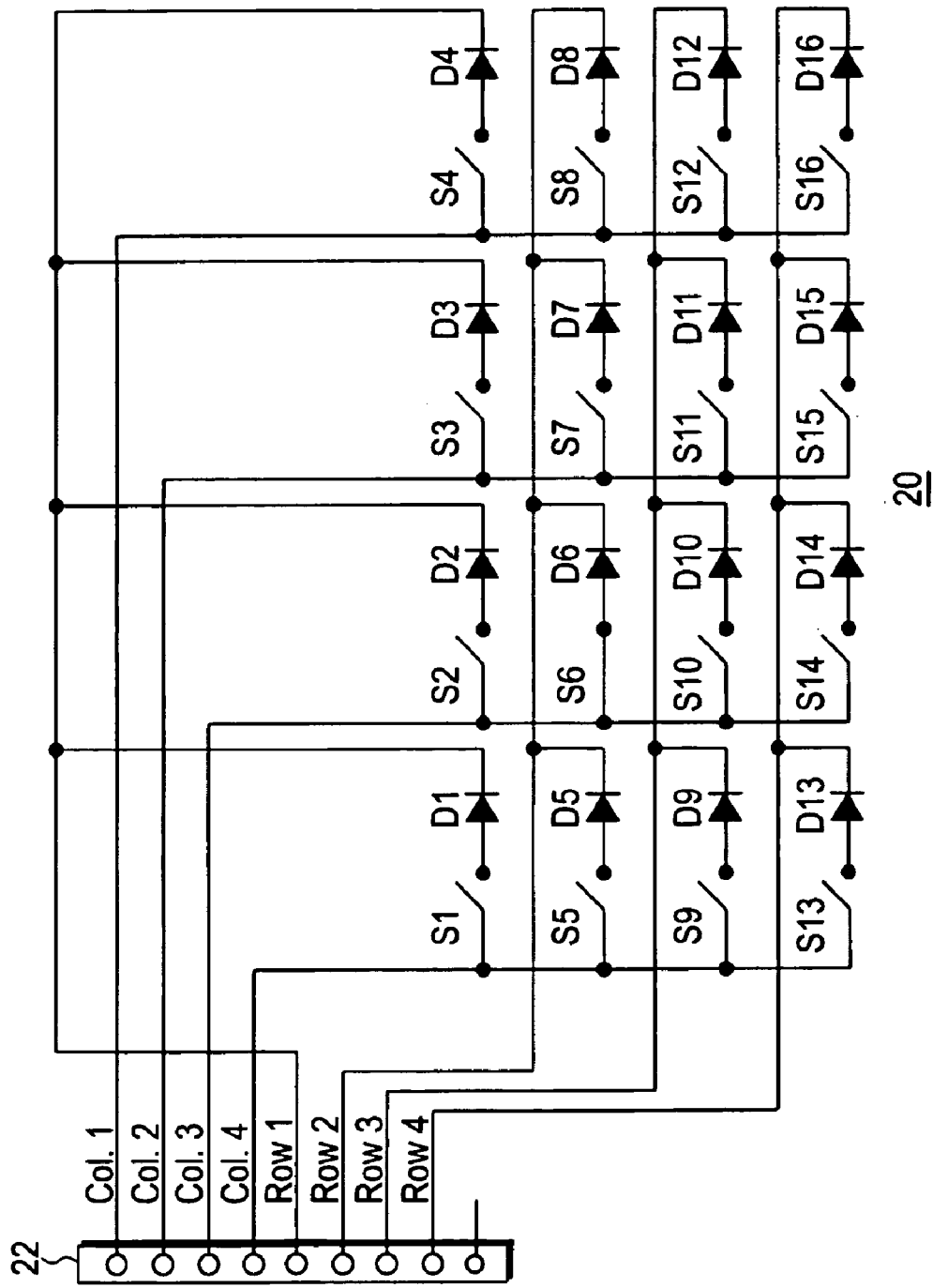
FIG. 3 illustrates conventional standard 4×4 switch matrix that indicates switch selection while avoiding ghosting.
Figure 4:
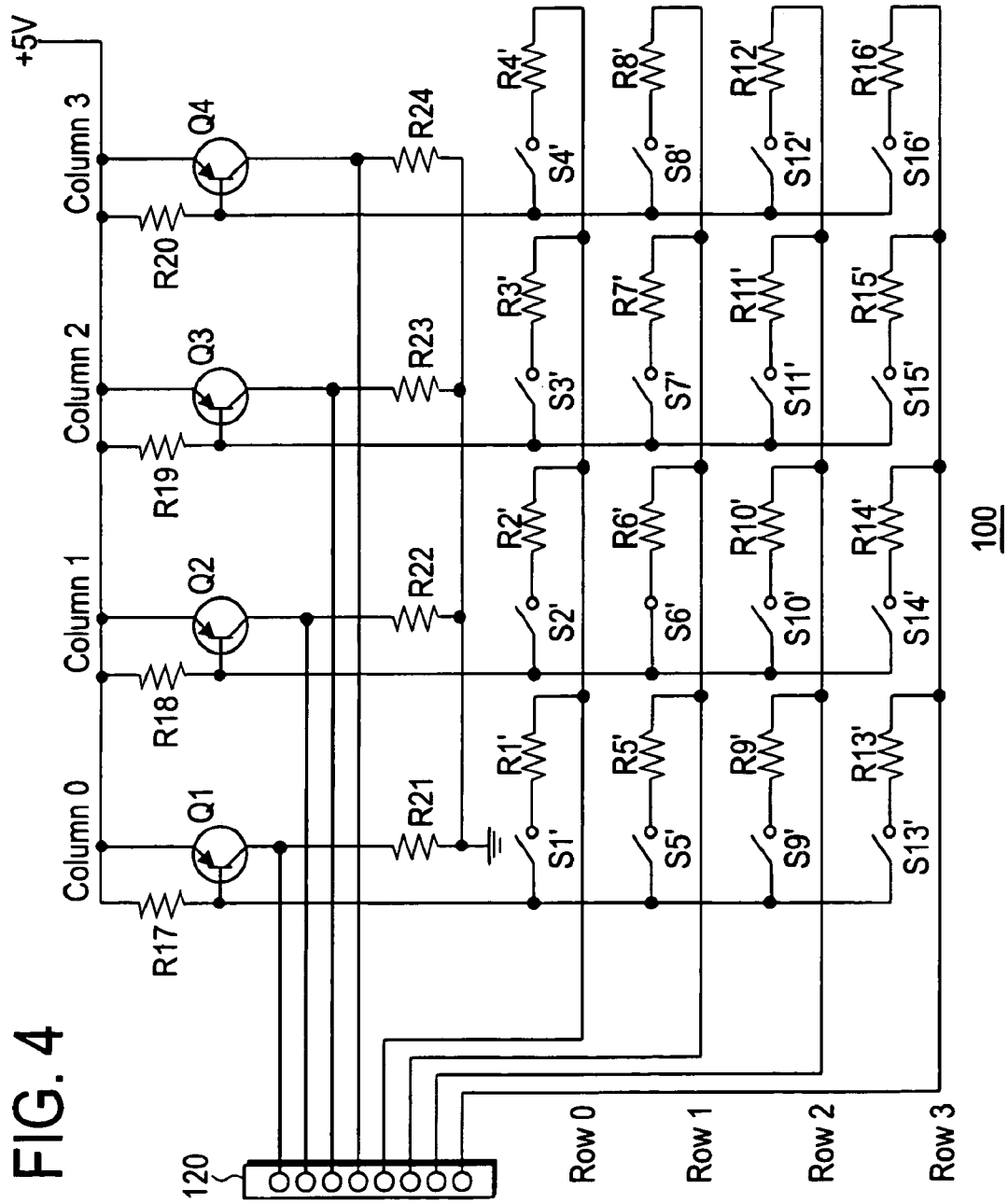
FIG. 4 illustrates a schematic of a current sensing switch matrix in accordance with one embodiment of the present invention.

FIG. 4 illustrates a schematic of a current sensing switch matrix 100 in accordance with one embodiment of the present invention. As indicated by its name, the detection of a closed switch in the matrix is based on current. Similar to the conventional matrix, only one of the rows is driven low at a time. In the example of FIG. 4, 16 switches, S1' through S16', are included and each is coupled to one of 16 resistors, R1' through R16', (e.g., each 240 Kohm) respectively. Further coupled to the switches S1'-S16' is a current sensing circuit that includes a transistor (Q1, Q2, Q3, and Q4, e.g., bipolar junction transistors), and at least one resistor (R17, R18, R19, and R20, (e.g. each 240 Kohm) R21, R22, R23, and R24, (e.g., each 4.7 Kohm)) for each column, Column_0, Column_1, Column_2, and Column_3, of the switch matrix.

To illustrate operation within the switch matrix of FIG. 4, one switch, S6', is show as closed. When Row_1 is driven low by a processor 120 coupled to the current sensing circuit, current flows through R6' and R18, as well as the base to emitter junction of Q2, which is the forward current path indicated by the arrow of Q2, as is well appreciated by those skilled in the art. Note that since only Row_1 is driven low, only the switches on Row_1 (S5', S6', S7', or S8') can switch on the transistors Q1 through Q4, respectively.

With the current flowing through the transistor Q2, the small base current is amplified into a large emitter to collector current. The emitter current is converted into a voltage by R22. Since the resistor R22 converts the current into a voltage, the current is sensed on Column_1 as logic 1 by the processor 120. The logic 1 on Column_1 indicates to the processor, 120 that the switch S6', at the intersection of Row_1 and Column_1, is closed.

Figure 5:
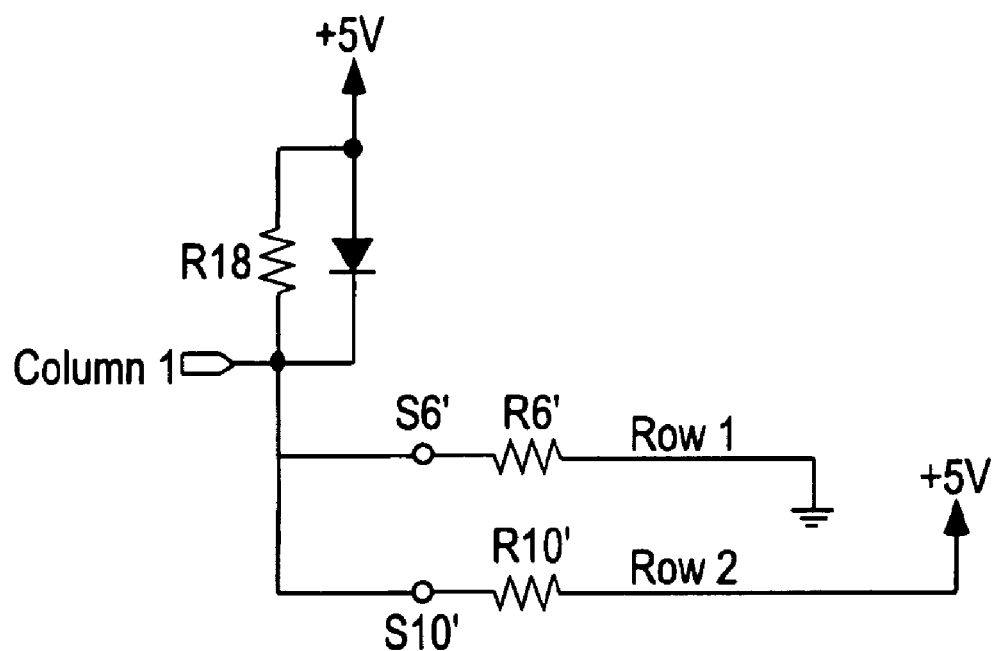
FIG. 5 illustrates a voltage divider perspective of the circuit of FIG. 4 where switches S10' and S6' are closed.

From a voltage divider perspective, if S10' were closed in addition to S6', then R10', R18, and R6' will form a voltage divider network as shown in FIG. 5. Since R6' sees a drop of about 4.4V, it is conducting about 18.3 µA (microAmperes) of current. R10' and R18 each conduct only about 0.6V/240K=2.5 µA. Accordingly, the balance of the current (18.3−2.5−2.5=13.3 µA) has to be flowing through the base of Q2, which still indicates that Q2 has been switched on and is sufficient to detect the closed switches when the appropriate row for each switch is driven low. In fact, even if all four switches in Column_1 are closed, then the base of Q2 still has to be conducting about 8.3 µA, which is sufficient to turn on Q2 and pull Column_1 high to properly indicate the closed switches. Preventing ghosting with multiple switches closed occurs by applying the principle that no two rows will be in the unique logic zero state simultaneously. Since the base to emitter junction of the transistor supplies ensures that the column will not drop below about 4.4V, i.e., no more than 0.6 V or so below the emitter or supply voltage of +5V in the example, even if switches S10' and S6' are both closed, for example, there will never be enough current through S10' to turn on any other transistors.

It should be noted that the term "processor" as used herein can refer to a variety of different types of controller circuits, such as microprocessors, microcontrollers, digital signal processors (DSP's), programmable logic arrays (PGA's), digital logic or state machines, etc.

Figure 6:
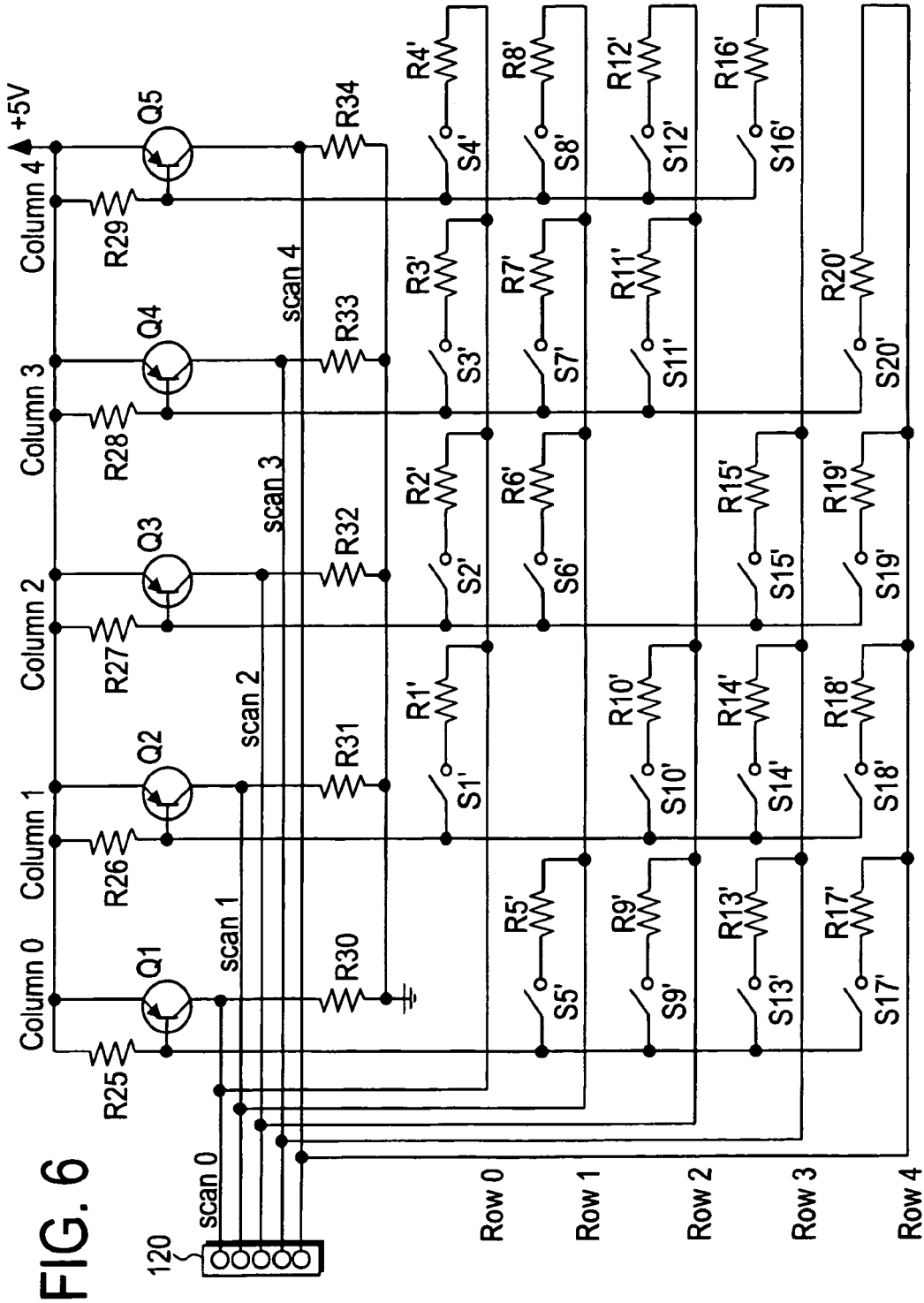
FIG. 6 illustrates a second embodiment of the present invention that utilizes a single set of scan lines for input and output.

FIG. 6 illustrates a second embodiment of a switch matrix 200 of the present invention that utilizes a single set of scan lines (scan 0–scan 4) for input and output. However, each scan line cannot be both an input and an output simultaneously. In order to support bi-directional scan lines, preferably the switches in the matrix are configured as rows and columns where the switch matrix has an off-set diagonal configuration of switches, so that there is a switch at each row and column intersection except for one intersection in each row, and the intersection lacking the switch lies in a different column among the rows. Further, in order to maintain the principle that only one row can be in the unique logic low state, only one scan line is to be driven low by the processor 120 at a time, while one of the other scan lines acts an input line signal to the processor to read, and all other scan lines are driven high by the processor. For example, if switch S1 of row 0 is to be tested, scan line 0 is driven low by the processor 120. In this case, scan line 1 acts as the input to processor 120 and the remaining scan lines 2 and 3 are driven high by the processor so that no current is passed through any other switches.

In this alternate embodiment, the use of bi-directional scan lines limits the scanning to only one switch at a time, instead of the conventional one row at a time. However, for a typical processor with a loop rate of 1 kHz (kiloHertz), the scanning of twenty switches is accomplished in about 20 ms (milliseconds), or one fiftieth of a second, i.e., the complete matrix can be scanned 50 times per second, which is sufficient for software debounce. Further, the utilization of the bi-directional scan lines realizes significant potential in saving cost.

In general, the number of switches that can be supported by a given number of I/O lines for a standard matrix is R×C, where R refers to the number of rows and C refers to the number of columns in the matrix. The number of switches in the matrix of the present invention grows in correspondence with S(S-1), where S refers to the number of scan lines. Notice that the number of switches supported by the conventional matrix grows roughly as $\frac{1}{4}S^2$, whereas with the matrix of the present invention, the number grows as $S^2-S$. As shown by the following table, for a same number of I/O lines/pins, over three times the number of switches can be supported with the matrix in accordance with the present invention, as compared with the conventional matrix.

| I/O LINES | STANDARD MATRIX SWTICHES | INVENTIVE MATRIX SWITCHES |
|---|---|---|
| 1 | 1 | 1 |
| 2 | 1 | 2 |
| 3 | 2 | 6 |
| 4 | 4 | 12 |
| 5 | 6 | 20 |
| 6 | 9 | 30 |
| 7 | 12 | 42 |
| 8 | 16 | 56 |

Thus, a processor with fewer I/O lines can be used to support the same size or larger matrix than conventionally done, which allows for potential cost savings in the use of a smaller, cheaper processor. When used with the same size processor as in the conventional circuit, the current sensing matrix can make available additional I/O lines that are no longer needed to support matrix scanning, thus allowing other features and value to be added to the product, as compared with an I/O intensive standard scan matrix. Of course, additional cost savings are achieved by eliminating the anti-ghosting diodes and replacing them with much lower cost resistors.

Figure 7:
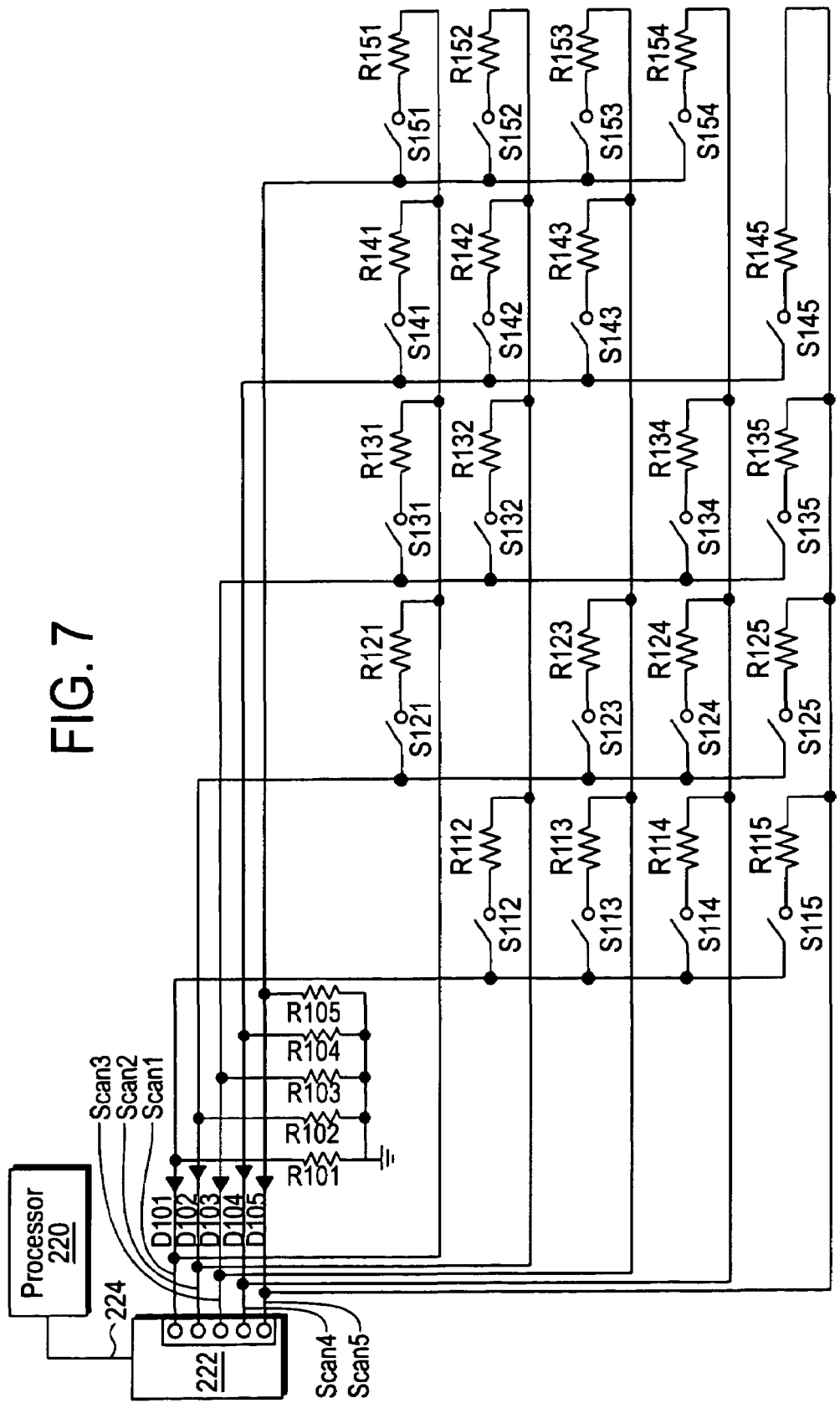
FIG. 7 illustrates another embodiment of the present invention utilizing bi-directional scan lines.

FIG. 7 illustrates another embodiment of a switch matrix in accordance with the present invention that also utilizes a single set of scan lines, SCAN1 through SCAN5, for input and output. Associated with each switch in the matrix is a resistor, e.g., a 10 Kohm resister, and associated with each scan line is a diode and resistor, e.g., a 100 Kohm resistor. With this embodiment, a voltage sensing method is utilized, where a voltage threshold sensing circuit 222 can be employed to sense voltage levels on the scan lines that correlate to unique switch states. The circuit 222 converts the voltage levels received from the switch circuit on the scan lines to logic states suitable for the processor 220, e.g. voltages above the set threshold are converted to a logic state of 1, and voltages below the threshold are a logic 0. Processor 220 is coupled to the circuit 222 by a signal bus 224. The circuit 222 can be an analog to digital converter, for example. In one embodiment, the processor 220, the analog to digital converter 222 (for sensing voltages), and a general purpose input/output circuit (for allowing scanning of the scan lines) can all be included in a single package, such as a ST7263 Microcontroller. In other embodiments, the components can be separate or other types of circuits can be used convert to logic states. For example, in a different embodiment, a voltage level converter including a transistor, as is known in the art, can be used on each scan line.

The voltage sensing matrix offers a lower cost implementation, since it replaces N transistors with N diodes (where N represents the number of scan lines), diodes being lower in cost than transistors. The constraints in determining the unique switch state include utilizing one of the scan lines as an analog input, driving one of the scan lines to a logic high level, and driving the remaining scan lines to logic low levels, where a processor, as described previously, performs the scan line driving.

In sensing switch state in this embodiment, the switch that is being sensed is the one determined by the unique intersection of the row that is driven high and the column that is being sensed. For example, in the matrix shown in FIG. 7, if SCAN1 through SCAN3 are at logic 0, SCAN4 is at logic 1, and SCAN5 is the input scan line, then switch S154, if closed, is the unique switch that could pull SCAN5 to a high logic level (+5V for 5V CMOS logic). While there may be the presence of other closed switches in the matrix, even if multiple switches are closed, there would still be sufficient ability to indicate a unique switch state. In general, with this embodiment, a unique switch is determined to be closed when the voltage on the input scan line exceeds one diode voltage level drop from logic 0 voltage level plus a small voltage allocation for noise margin. Additional noise margin could be added by using Schottkey diodes instead of standard small signal diodes, as is well appreciated by those skilled in the art.

By way of example, if S151, S152, and S153 or any combination thereof are closed in addition to S154, then the voltage on SCAN5 will be in the range of 1.24V to 5V, depending on the number of switches S151 through S153 that are additionally closed. If switches S115, S125, S135, S141, S142, and S143 are also closed, then the voltage on SCAN5 would be at least 1.09 volts, which is still higher than a silicon diode nominal forward voltage drop of 0.7V, and thus, would still sufficiently indicate a high logic level for a closed switch. Thus, in this example, the threshold used for high and low logic states is about 1.0 to 1.1 volts.

The resistors R101 through R105 are a practical addition to the matrix for applications where the controlling device has leakage currents that could adversely affect the voltage level on the input scan line. The diodes D101 through D105 ensure that the unique switch determined by the intersection of the logic one scan line row and the sense line column can bring the input scan line to a voltage level that exceeds one diode drop above logic 0. If the diodes were not present and the line shorted, then a second switch determined by the intersection of the column driven high and the input sense line row could also pull the sense line to a voltage that is higher than one diode drop from logic 0. Thus, none of the switches except for the unique switch described above can apply a voltage to the input scan line, and no combination of switches is likewise able to apply a voltage to the sense line that exceeds one diode drop from the logic 0 voltage level of the scan lines that are configured as logic 0. This provides anti-ghosting for the matrix.

Alternatively, the matrix could be arranged more as a half-matrix, such that only the upper (i.e., switches S121, 131, 141, 151, 132, 142, 152, 143, 153, 154) or lower (i.e., switches S112, 113, 123, 114, 124, 134, 115, 125, 135, 145) off-diagonal set of switches is populated. In this arrangement, the diodes would no longer be required, since the closed switch that is pulling the input scan line above one diode drop from logic 0 would be unique. A half-matrix arrangement could also be utilized with the above-described current sensing embodiment to eliminate the need to use transistors. While the half-matrix arrangement does reduce the number of switches being sensed, the total number still exceeds what could be supported in the prior art arrangement. For example, when N=5, as is FIG. 7, a switch matrix of one of the above embodiments with active components supports 20 switches versus 10 switches for the half matrix without active components. In contrast, a standard switch matrix would only support 6 switches.

Another alternate can be achieved by inverting the logic sense of all driven and sensed lines and reversing the diode direction, if included. In this variation, the valid voltage level that indicates "closed" is any voltage level above 0 volts plus allocation for noise margin. There is similarly a symmetrical inverse design for the current sensing matrix.

From the foregoing, it will be observed that numerous variations and modifications may be effected without departing from the spirit and scope of the novel concept of the invention. It is to be understood that no limitation with respect to the specific methods and apparatus illustrated herein is intended or should be inferred. For example, the switch matrix of the present invention can be used in a wide variety of interface or electronic devices, including keyboards, joysticks, gamepads, steering wheels, cellular phones, PDA'S, electronic appliances, or any device having multiple electrical switches or buttons. The processor controlling the scanning can be integral to the device having the switches, or be located across a physical or wireless bus. It is, of course, intended to cover by the appended claims all such modifications as fall within the scope of the claims.

What is claimed is:

1. A switch matrix circuit comprising:
    a plurality of switches organized in a row and column configuration; and
    a current sensing circuit coupled to the plurality of switches, the current sensing circuit including a transistor per column of the plurality of switches, and a plurality of resistors each electrically coupled in series with an associated one of the plurality of switches, wherein current amplified by the transistor in a column is sensed as a logic state indicative of a switch status of a switch within the column for a selected row, and wherein the column is configured to conduct at least a threshold current level required for the transistor to perform the amplification if the switch is closed, and to conduct less than the threshold current level if the switch is open, regardless of how many other of the plurality of switches are closed.

2. The switch matrix circuit of claim 1, wherein the transistor comprises a bipolar junction transistor.

3. The switch matrix circuit of claim 1, wherein the row and column configuration further comprises an off-diagonal configuration having one switch per row and column intersection in all but one intersection per row.

4. The switch matrix circuit of claim 3, wherein each intersection lacking a switch lies in a different column within each row.

5. The switch matrix circuit of claim 4, wherein a single scan line supports providing a row input signal or reading a column output signal for one row and one column within the off-diagonal configuration.

6. The switch matrix circuit of claim 1, wherein a processor is configured to sense the switch status.

7. A circuit for more efficient switch selection sensing, the circuit comprising:
    a switch matrix comprising a plurality of switches organized as a plurality of rows and columns;
    a current sensing circuit coupled to the switch matrix; and
    a processor coupled to the switch matrix and the current sensing circuit by a plurality of scan lines, wherein selection of a single row by a scan line returns column current levels from the current sensing circuit to detect if a switch at an intersection of the single row and a column of the switch matrix is closed, and wherein a column current level associated with the column is at least a threshold current level required for detection if the switch is closed, and the column current level associated with the column is less than the threshold current level if the switch is open, regardless of how many other of the plurality of switches are closed.

8. The circuit of claim 7, wherein the plurality of scan lines further comprises a plurality of bi-directional scan lines, wherein each scan line provides both row selection and column sensing capabilities.

9. The circuit of claim 8, wherein the organization of the plurality of switches further comprise an off-diagonal organization to support the bi-directional scan lines.

10. The circuit of claim 7, wherein the current sensing circuit further comprises a circuit comprising a plurality of transistors each coupled to an associated column, and a plurality of resistors each coupled in series with an associated one of the plurality of switches in the switch matrix.

11. The circuit of claim 10, wherein the column current level associated with the column is at least the threshold current level when the transistor coupled to the column is turned on.

12. The circuit of claim 10, wherein the transistor comprises a bipolar junction transistor.

13. A method for sensing switch statuses, the method comprising:
    coupling a current sensing circuit to a switch matrix having a plurality of switches in a row and column configuration comprising one switch per row and column intersection;
    amplifying a current signal; and
    detecting a switch status of a switch within the switch matrix based on whether a current signal in the current sensing circuit comprises at least a threshold current level, regardless of how many other of the plurality of switches are closed.

14. The method of claim 13, further comprising forming the current sensing circuit comprising a transistor per column of the plurality of switches and a plurality of resistors each electrically coupled in series with an associated one of the plurality of switches.

15. The method of claim 14, wherein detecting the switch status of the switch further comprises detecting current amplified by the transistor in a column as a logic state indicative of the switch status of the switch, wherein the switch is located at an intersection of the column and a selected row.

16. The method of claim 14, wherein the transistor per column of the plurality of switches comprises a bipolar junction transistor.

17. The method of claim 13, wherein the switch matrix further comprises a plurality of bi-directional scan lines, wherein each bi-directional scan line provides both row selection and column sensing capabilities.

18. The method of claim 17, wherein the plurality of switches comprises an off-diagonal organization to support the bi-directional scan lines.

19. The method of claim 13, wherein the row and column configuration comprises a first row and a second row, and wherein detecting the switch status comprises:
    scanning the first row of the switch matrix; and then
    scanning the second row of the switch matrix.

20. A switch matrix circuit comprising:
    a plurality of switches organized in a row and column off-diagonal configuration having one switch per row and column intersection in all but one intersection per row; and
    a plurality of bi-directional scan lines, wherein a single bi-directional scan line provides both row selection and column sensing capabilities for switch status identification, wherein:
        a first bi-directional scan line of the plurality of bi-directional scan lines is configured to conduct a first signal associated with a first logic state to a selected row of the switch matrix coupled thereto;
        a second bi-directional scan line of the plurality of bi-directional scan lines is configured to be scanned for an output signal comprising at least a threshold level, wherein the output signal comprises at least the threshold level only if a scanned switch at an intersection of the selected row and a scanned column of the switch matrix is selected, wherein the scanned column is coupled to the second bi-directional scan line; and each of the other bi-directional scan lines of the plurality of bi-directional scan lines is configured to conduct a second signal associated with a second logic state opposite the first logic state.

21. The switch matrix of claim 20, wherein the one intersection per row lacking a switch lies in a different column within each row.

22. The switch matrix of claim 20, wherein an analog to digital converter is configured to sense switch status for the scanned switch, wherein a closed switch status is sensed if the output signal comprises at least the threshold level, and an open switch status is sensed if the output signal comprises less than the threshold level.

23. The switch matrix of claim 20, further comprising a diode and resistor circuit for each scan line.

24. The method of claim 13, wherein detecting the switch status of the switch comprises:

receiving a base current level associated with a low logic state in a selected row of the switch matrix, wherein the switch is located at the intersection of the selected row and a column;

if the switch is closed, amplifying at least a portion of the base current level conducted by the column to at least the threshold current level with a transistor coupled at its base to the column and at its emitter to a scan line; and scanning the scan line for the current signal, wherein the switch status is open if the current signal is less than the threshold current level, and wherein the switch status is closed if the current signal is at least the threshold current level.

25. The method of claim 24, wherein the selected row is a first selected row, and further comprising:

before receiving the base current level in the first selected row, selecting the first selected row from a selectable plurality of rows in the switch matrix;

discontinuing to receive the base current level in the first selected row;

selecting a second row from the plurality of selectable rows; and receiving the base current level in the second row.

\* \* \* \* \*

UNITED STATES PATENT AND TRADEMARK OFFICE
CERTIFICATE OF CORRECTION

PATENT NO. : 7,151,432 B2
APPLICATION NO. : 09/957004
DATED : December 19, 2006
INVENTOR(S) : Kollin Tierling It is certified that error appears in the above-identified patent and that said Letters Patent is hereby corrected as shown below:

Under "BACKGROUND OF THE INVENTION"

Column 2 Line 16, the words "thanthe" should read -- than the --

Under "SUMMARY OF THE INVENTION"

Column 2, Line 58, the word "linens" should read -- lines --

Signed and Sealed this

Twenty-seventh Day of March, 2007

JON W. DUDAS
*Director of the United States Patent and Trademark Office*